United States Patent
Leung et al.

(10) Patent No.: US 7,392,456 B2
(45) Date of Patent: Jun. 24, 2008

(54) PREDICTIVE ERROR CORRECTION CODE GENERATION FACILITATING HIGH-SPEED BYTE-WRITE IN A SEMICONDUCTOR MEMORY

(75) Inventors: Wingyu Leung, Cupertino, CA (US); Kit Sang Tam, Menlo Park, CA (US)

(73) Assignee: MoSys, Inc., Sunnyvale, CA (US)

( * ) Notice: Subject to any disclaimer, the term of this patent is extended or adjusted under 35 U.S.C. 154(b) by 373 days.

(21) Appl. No.: 10/997,604

(22) Filed: Nov. 23, 2004

(65) Prior Publication Data
US 2006/0123322 A1   Jun. 8, 2006

(51) Int. Cl.
*G11C 29/00* (2006.01)

(52) U.S. Cl. ............................................. 714/763
(58) Field of Classification Search .............. 714/764, 714/773, 763
See application file for complete search history.

(56) References Cited

U.S. PATENT DOCUMENTS

| | | | |
|---|---|---|---|
| 3,814,921 A * | 6/1974 | Nibby et al. ............... | 714/764 |
| 3,969,706 A | 7/1976 | Proebstring et al. | |
| 4,045,783 A | 8/1977 | Harland | |
| 4,317,201 A | 2/1982 | Sedalis | |
| 4,345,328 A | 8/1982 | White | |
| 4,380,812 A | 4/1983 | Ziegler, II et al. | |
| 4,389,714 A | 6/1983 | Nakao | |
| 4,561,095 A | 12/1985 | Khan | |
| 4,694,454 A | 9/1987 | Matsuura | |
| 4,706,248 A | 11/1987 | Masaki | |
| 4,726,021 A | 2/1988 | Horiguchi et al. | |
| 4,740,968 A | 4/1988 | Aichelmann, Jr. | |
| 4,768,197 A * | 8/1988 | Petolino et al. ............. | 714/754 |
| 4,782,487 A | 11/1988 | Smelser | |

(Continued)

FOREIGN PATENT DOCUMENTS

GB    2289779    11/1995

(Continued)

OTHER PUBLICATIONS

Dosaka et al. "A 100-MHz 4-Mb Cache DRAM with Fast Copy-Back Scheme", IEEE Journal of Solid-State Circuits, vol. 27, No. 11, Nov. 1992, pp. 1534-1539.

(Continued)

*Primary Examiner*—Stephen M. Baker
(74) *Attorney, Agent, or Firm*—Bever, Hoffman & Harms, LLP; E. Eric Hoffman

(57) ABSTRACT

Write check bits are generated in a predictive manner for partial-word write transactions in a memory system implementing error code correction. A read data word and associated read check bits are read from an address of the memory. If an error exists in a byte of the read data word, this byte is identified. At the same time, one or more bytes of the uncorrected read data word are merged with one or more bytes of a write data word, thereby creating a merged data word. Write check bits are generated in response to the merged data word. If the merged data word includes a byte of the read data word, which contains an error, the write check bits are modified to reflect this error. The merged data word and the modified (or unmodified) write check bits are then written to the address of the memory.

9 Claims, 4 Drawing Sheets

U.S. PATENT DOCUMENTS

| | | | |
|---|---|---|---|
| 4,794,597 A | 12/1988 | Ooba et al. | |
| 4,839,868 A | 6/1989 | Sato et al. | |
| 4,884,271 A * | 11/1989 | Concha et al. | 714/764 |
| 4,933,904 A | 6/1990 | Stewart et al. | |
| 4,939,694 A | 7/1990 | Eaton et al. | |
| 5,003,542 A | 3/1991 | Mashiko et al. | |
| 5,008,886 A * | 4/1991 | Chinnaswamy et al. | 714/764 |
| 5,151,906 A | 9/1992 | Sawada | |
| 5,177,743 A | 1/1993 | Shinoda et al. | |
| 5,233,616 A | 8/1993 | Callander | |
| 5,235,693 A * | 8/1993 | Chinnaswamy et al. | 711/159 |
| 5,241,503 A | 8/1993 | Cheng | |
| 5,274,646 A | 12/1993 | Brey et al. | |
| 5,289,584 A | 2/1994 | Thome et al. | |
| 5,369,651 A * | 11/1994 | Marisetty | 714/767 |
| 5,402,389 A | 3/1995 | Flannagan et al. | |
| 5,430,742 A * | 7/1995 | Jeddeloh et al. | 714/764 |
| 5,434,868 A | 7/1995 | Aichelmann, Jr. et al. | |
| 5,469,558 A | 11/1995 | Lieberman et al. | |
| 5,502,835 A | 3/1996 | Le et al. | |
| 5,513,148 A | 4/1996 | Zagar | |
| 5,519,839 A | 5/1996 | Culley et al. | |
| 5,519,847 A | 5/1996 | Fandrich et al. | |
| 5,524,220 A | 6/1996 | Verma et al. | |
| 5,533,194 A | 7/1996 | Albin et al. | |
| 5,535,226 A | 7/1996 | Drake et al. | |
| 5,579,267 A | 11/1996 | Koshikawa | |
| 5,586,282 A | 12/1996 | Iino et al. | |
| 5,592,435 A | 1/1997 | Mills et al. | |
| 5,615,169 A | 3/1997 | Leung | |
| 5,638,385 A | 6/1997 | Fifield et al. | |
| 5,671,187 A | 9/1997 | Childers et al. | |
| 5,687,353 A * | 11/1997 | Chen et al. | 711/155 |
| 5,708,624 A | 1/1998 | Leung | |
| 5,778,237 A | 7/1998 | Yamamoto et al. | |
| 5,829,026 A | 10/1998 | Leung et al. | |
| 5,933,436 A | 8/1999 | Tanzawa et al. | |
| 5,961,655 A | 10/1999 | Johnson et al. | |
| 6,020,773 A | 2/2000 | Kan et al. | |
| 6,052,011 A | 4/2000 | Dasgupta | |
| 6,052,816 A | 4/2000 | Yoshinogawa | |
| 6,065,146 A | 5/2000 | Bosshart | |
| 6,101,614 A | 8/2000 | Gonzales et al. | |
| 6,147,535 A | 11/2000 | Leung | |
| 6,374,381 B1 | 4/2002 | Moriya | |
| 6,549,460 B2 | 4/2003 | Nozoe et al. | |
| 6,563,745 B1 | 5/2003 | Ilkbahar | |
| 6,697,992 B2 | 2/2004 | Ito et al. | |
| 6,701,480 B1 | 3/2004 | Karpuszka et al. | |
| 6,738,883 B2 | 5/2004 | March et al. | |
| 6,781,898 B2 | 8/2004 | Kim et al. | |
| 6,799,287 B1 | 9/2004 | Sharma et al. | |
| 6,854,059 B2 | 2/2005 | Gardner | |
| 7,064,993 B2 | 6/2006 | Gyohten et al. | |
| 7,099,216 B2 | 8/2006 | Luk et al. | |
| 2002/0029365 A1 * | 3/2002 | Sato et al. | 714/763 |
| 2004/0039883 A1 | 2/2004 | LaBerge et al. | |
| 2004/0044943 A1 | 3/2004 | Jacquet et al. | |
| 2004/0064646 A1 * | 4/2004 | Emerson et al. | 711/131 |
| 2004/0172504 A1 | 9/2004 | Balazich et al. | |
| 2004/0213064 A1 | 10/2004 | Gyohten et al. | |
| 2005/0185492 A1 | 8/2005 | Harrand | |
| 2006/0034132 A1 | 2/2006 | Jain | |
| 2006/0080589 A1 | 4/2006 | Holm et al. | |
| 2006/0156196 A1 | 7/2006 | Takahashi et al. | |
| 2006/0158950 A1 * | 7/2006 | Klein | 365/222 |
| 2006/0200723 A1 | 9/2006 | Carnevale et al. | |
| 2006/0200728 A1 | 9/2006 | Nagai et al. | |

FOREIGN PATENT DOCUMENTS

| | | |
|---|---|---|
| JP | 55055499 | 4/1980 |

OTHER PUBLICATIONS

Bondurant, D. "15nsec Enhanced DRAM Upgrades System Performance in 72-Pin SIMM Socket", Silicon Valley Personal Computer Design Conference Proceedings (date of publication unknown), pp. 81-86.

Sunaga et al. "A Full bit Prefetch Architecture for Synchronous DRAM's", IEEE Journal of Solid-State Circuits, vol. 30, No. 9, Sep. 1995, pp. 998-1005.

Intel, "Pentium Processor 3.3V Pipelined BSRAM Specification", Ver. 2.0, May 25, 1995, pp. 1-44.

IDT, Inc. "A 16-Bit CMOS Error Detection & Correction Unit", Apr. 1990, pp. 1-19.

Hsiao, M.Y. "A Class of Optimal Minimum Odd-weight-column SEC-DED Codes", Jul. 1970, pp. 395-401.

Jarwala et al. "Cost Analysis of On Chip Error Control Coding for Fault Tolerant Dynamic RAMs", 1987 IEEE, pp. 278-283.

IBM Corp. "Error Correction Circuit for Dynamic Random Access Memories", vol. 36, No. 8, Aug. 1983, pp. 681-682.

Hegde, A. "Error Detection and Correction with the IDT49C466", Microprocessors & Microsystems, vol. 18, No. 10, Dec. 1994; pp. 613-620.

* cited by examiner

PREDICTIVE ERROR CORRECTION CODE GENERATION FACILITATING HIGH-SPEED BYTE-WRITE IN A SEMICONDUCTOR MEMORY

RELATED APPLICATIONS

The present application is related to pending U.S. patent application Ser. No. 10/645,861, "Transparent Error Correcting Memory" by Wingyu Leung, Kit-Sang Tam, Mikolaj Tworek and Fu-Chieh Hsu, which is a continuation in part of pending U.S. patent application Ser. No. 10/003,602, "Error Correcting Memory And Method of Operating Same" by Wingyu Leung and Fu-Chieh Hsu. The present invention is also related to U.S. Pat. No. 6,147,535, entitled "Clock Phase Generator for controlling operation of a DRAM Array" by Wingyu Leung.

FIELD OF THE INVENTION

The present invention relates to semiconductor memory systems, such as static random access memory (SRAM) systems or dynamic random access memory. (DRAM) systems. In particular, the present invention relates to a method and apparatus of error detection and correction in a semiconductor memory that supports partial-word write operations.

RELATED ART

Semiconductors memories such as DRAM and SRAM devices are susceptible to both soft and hard errors. Soft errors are generated when sub-atomic energetic particles hit the memory device and generate charge high enough to upset the state of one or more memory cells. Hard errors are generated by defects in the semiconductor device during the manufacturing process. The incorporation of error detection and correction circuitry in memory devices has been described in many prior art schemes.

For example, U.S. Pat. No. 5,638,385, entitled "Fast Check Bit Write For A Semiconductor Memory" by John A. Fifield et al., describes the use of error-correction codes (ECC), such as error-correction check bits, in a memory using two different types of memory cells. Smaller and slower memory cells are used to store data bits, while larger and faster memory cells are for storing error-correction check bits. The faster cells provide faster write access to the error-correction check bits, thereby compensating for the delay associated with the generation of the error-correction check bits, and minimizing the impact of the ECC generation on the overall memory write latency. This, however, is accomplished at the cost of larger area.

U.S. Pat. No. 6,065,146, entitled "Error Correcting Memory" by Patrick Bosshart, describes an error-correcting memory that imposes no penalty on memory access latency or operating frequency. This error-correcting memory performs error correction only during a refresh operation of the memory, during a second or subsequent read operation of a burst read sequence, or during a write-back operation. As a result, the error correction scheme does not increase the read latency of the memory. Similarly, error correction check bits are only generated during refresh operations of the memory. As a result, the generation of error correction check bits does not increase the write latency of the memory. However, this error correction scheme cannot correct data errors occurring in the first read operation of a burst read sequence, or in data written to the memory before the error correction check bits are generated.

U.S. Pat. No. 5,003,542, entitled "Semiconductor Memory Device Having Error Correcting Circuit and Method For Correcting Error", by Koichiro Mashiko, et al., describes a memory that includes ECC circuitry incorporated in the sense amplifier area of the memory. More specifically, a second set of sense amplifiers and ECC correction logic is coupled to the bit lines of the memory array, thereby speeding up the error correction process by eliminating delays through the input/output (I/O) circuitry. However, this scheme requires that a second set of sense amplifiers and ECC correction logic be incorporated in each memory array. In general, there are many memory arrays in a memory device. As a result, this arrangement increases the array area and thus the silicon area of the memory. In addition, even though delays through the I/O circuit are eliminated, the delays through the ECC correction circuit still increase the memory cycle time. For a high-frequency memory, this increase is significant.

Many semiconductor memories support partial-word (e.g., byte) write operations. A partial-word write allows a write operation to be performed to the memory using a quanta of bits less than a word. A word is defined as the maximum number of bits that can be read or written in one memory access. A partial-word write is facilitated by partial-word write enable signals. For example, in a memory that supports write operations of words having multiple 8-bit bytes, each byte has an associated byte-write enable signal which, when activated in a write transaction, allows the corresponding byte to be written to the memory, while the other bits in the same word are not affected.

A partial-word write can also be accomplished using a read-modify-write operation. In a read-modify-write operation, a full word is first read from the memory. The partial-word to be written is then merged with the read data bits. That is, the partial-word replaces (overwrites) the desired portion of the read data bits. Subsequently, the merged data word is written to the memory. Therefore, the partial-word write operation requires both a read transaction and a write transaction to the memory.

In a memory that supports partial-word write operations, only a memory write transaction is required, thereby cutting the required number of memory transactions in half. A memory that supports partial-word write operations also eliminates the need for a merge operation outside the memory.

It would be desirable to have an improved memory system that supports partial-word write operations and also provides ECC protection, wherein the required number of ECC bits and the memory cycle time are minimized.

SUMMARY

Accordingly, the present invention provides a memory device or an embedded memory block that includes an array of memory cells with built-in ECC protection. The memory supports partial-word write operations. In one embodiment, the memory cells are DRAM cells. In another embodiment, the memory cells are SRAM, FeRAM, or MRAM cells.

Write check bits are generated in a predictive manner for partial-word write transactions in a memory system implementing error code correction. A read data word and associated read check bits are read from an address of the memory. If an error exists in a partial-word (e.g., byte) of the read data word, this partial-word is identified. At the same time, one or more partial-words of the uncorrected read data word are merged with one or more partial-words of a write data word, thereby creating a merged data word. Write check bits are generated in response to the merged data word. If the merged data word includes a partial-word of the read data word that contains an error, the write check bits are modified to reflect this error. The merged data word and the modified (or unmodified) write check bits are then written to the address of the memory.

The error-correction code function is designed to simplify and speed up partial syndrome decoding. The scheme allows both ECC generation in the read path and write path to be executed in parallel thereby eliminating a major propagation delay component typically associated with a read-modify-write process.

The present invention will be more fully understood in view of the following description and drawings.

DETAILED DESCRIPTION

Figure 1:
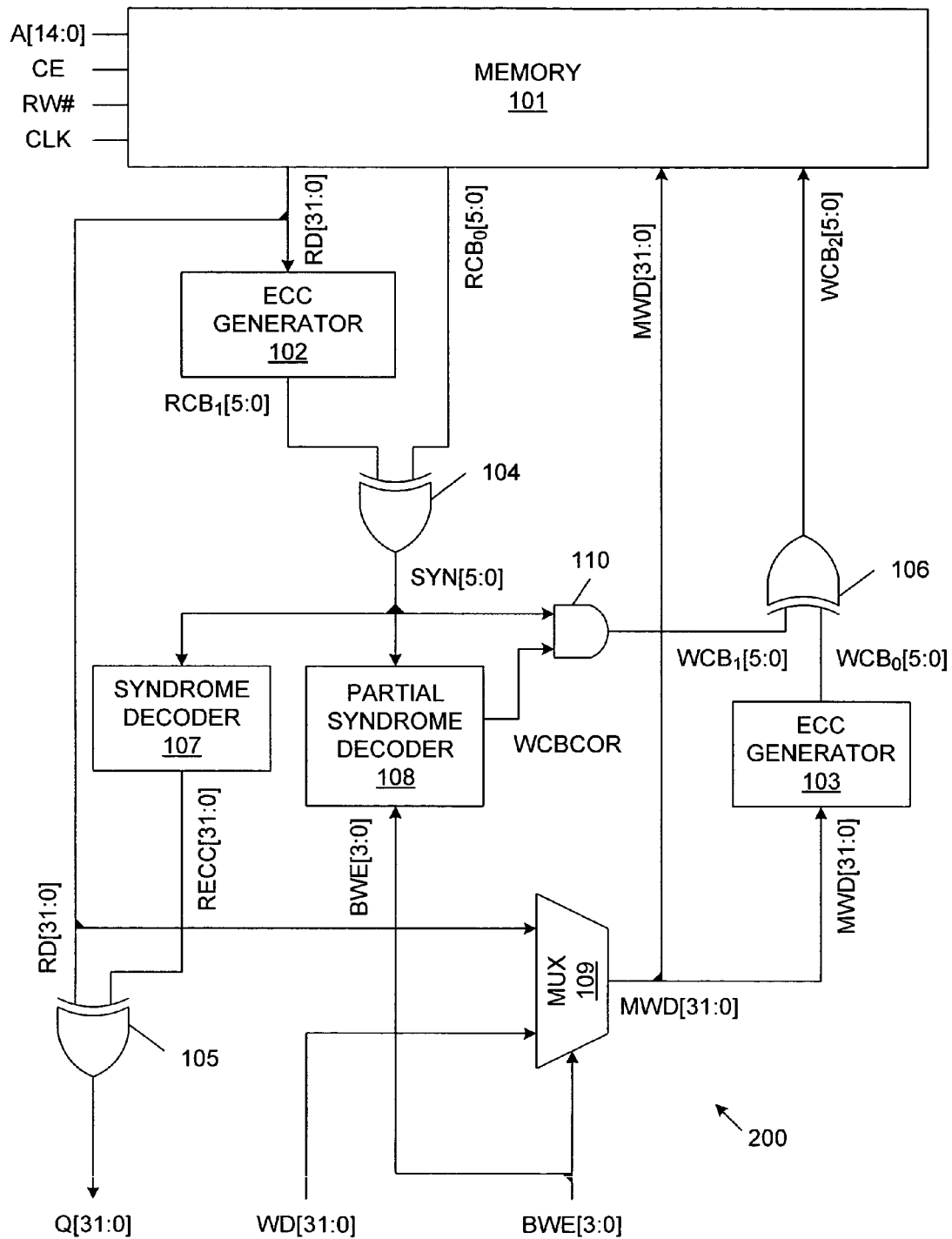
FIG. 1 is a block diagram of a memory system, which implements a partial-word write with predictive error correction in accordance with one embodiment of the present invention.

FIG. 1 is a block diagram of a memory system 100, which implements a partial-word write with predictive error correction in accordance with one embodiment of the present invention. Memory system 100 includes memory array 101, error correction code (ECC) generators 102-103, exclusive OR circuits 104-106, syndrome decoder 107, partial syndrome decoder 108, multiplexer circuit 109 and logical AND circuit 110. In the described embodiment, memory array 101 is organized as 32 k words of 32-bits each, and uses 6 check bits to facilitate single-bit error correction. However, other word sizes and check bit widths can be used in other embodiments.

As described in more detail below, memory system 100 supports byte-write transactions using a read-modify-write operation. Memory system 100 provides a standard interface similar to interfaces used in common synchronous SRAM systems. Thus, memory array 101 operates in response to an address signal A[14:0], a chip enable signal CE, a read/write indicator signal RW# and a clock signal CLK. Memory array 101 includes conventional circuitry, such as sense-amplifiers, and address decoders, associated with a semiconductor memory.

During a read operation (or a read-modify-write operation) a read data word RD[31:0] and corresponding check bits $RCB_0[5:0]$ are read from memory 101. The read data word RD[31:0] is provided to ECC generator 102, exclusive OR circuit 105 and multiplexer 109. The read check bits $RCB_0$ [5:0] are provided to exclusive OR circuit 104. ECC generator 102 generates a set of read check bits $RCB_1[5:0]$ in response to the read data word RD[31:0]. These read check bits $RCB_1\{5:0]$ are also provided to exclusive OR circuit 104. Exclusive OR circuit 304 generates a syndrome word SYN [5:0] in response to the read check bits $RCB_0[5:0]$ and $RCB_1$ [5:0]. This syndrome word SYN[5:0] is applied to syndrome decoder 107, partial syndrome decoder 108 and logical AND circuit 110.

Syndrome decoder 107 generates a read error correction code RECC[31:0] in response to the syndrome word SYN[5: 0]. This read error correction code RECC[31:0] is provided to exclusive OR circuit 105. Exclusive OR circuit 105 provides a read output word Q[31:0] in response to the read data word RD[31:0] and read error correction code RECC[31:0].

Byte write enable signals BWE[3:0] are provided to partial syndrome decoder 108 and to the control terminals of multiplexer circuit 109. Partial syndrome decoder 108 provides a write check bit correct signal WCBCOR to logical AND circuit 110 in response to the syndrome word SYN[5:0] and the byte write enable signals BWE[3:0]. Logical AND circuit 110 provides write check bits $WCB_1[5:0]$ to exclusive OR circuit 106 in response to the syndrome word SYN[5:0] and write check bit correct signal WCBCOR.

Multiplexer 109 also receives a write data word WD[31:0]. This multiplexer 109 provides a merged write data word MWD[31:0] in response to the byte write enable signals BWE[3:0], the read data word RD[31:0] and the write data word WD[31:0]. The merged write data word MWD[31:0] is provided to memory array 101 and ECC generator 103. ECC generator 103 generates write check bits $WCB_0[5:0]$ in response to the merged write data word MWD[31:0]. Exclusive OR circuit 106 provides write check bits $WCB_2[3:0]$ to memory array 101 in response to write check bits $WCB_1[5:0]$ and $WCB_0[3:0]$.

A read-modify-write operation in accordance with the present invention will now be described in more detail. The read-modify-write operation has an associated write address A[14:0], which identifies the word location to be written. The read-modify-write operation also has associated byte write enable signals BWE[3:0], which indicate which of the four bytes in the addressed word location are to be written. Each of the byte write enable signals BWE[3:0], when activated high, indicates that a write operation is to be performed on the corresponding byte. For example, byte write enable signals BWE[3:0] having values of "0011" would indicate that the first and second bytes of the addressed word will be written, while the third and fourth bytes of the addressed word will not be written. The byte write enable signals BWE[3:0] allow any combination of the 4 bytes in a word to be written in one write transaction.

During a read-modify-write operation, a read operation is performed to the specified write address in memory array 101, thereby causing a 4-byte read data word RD[31:0] and associated read check bits $RCB_0[5:0]$ to be read from memory array 101.

Figure 2:
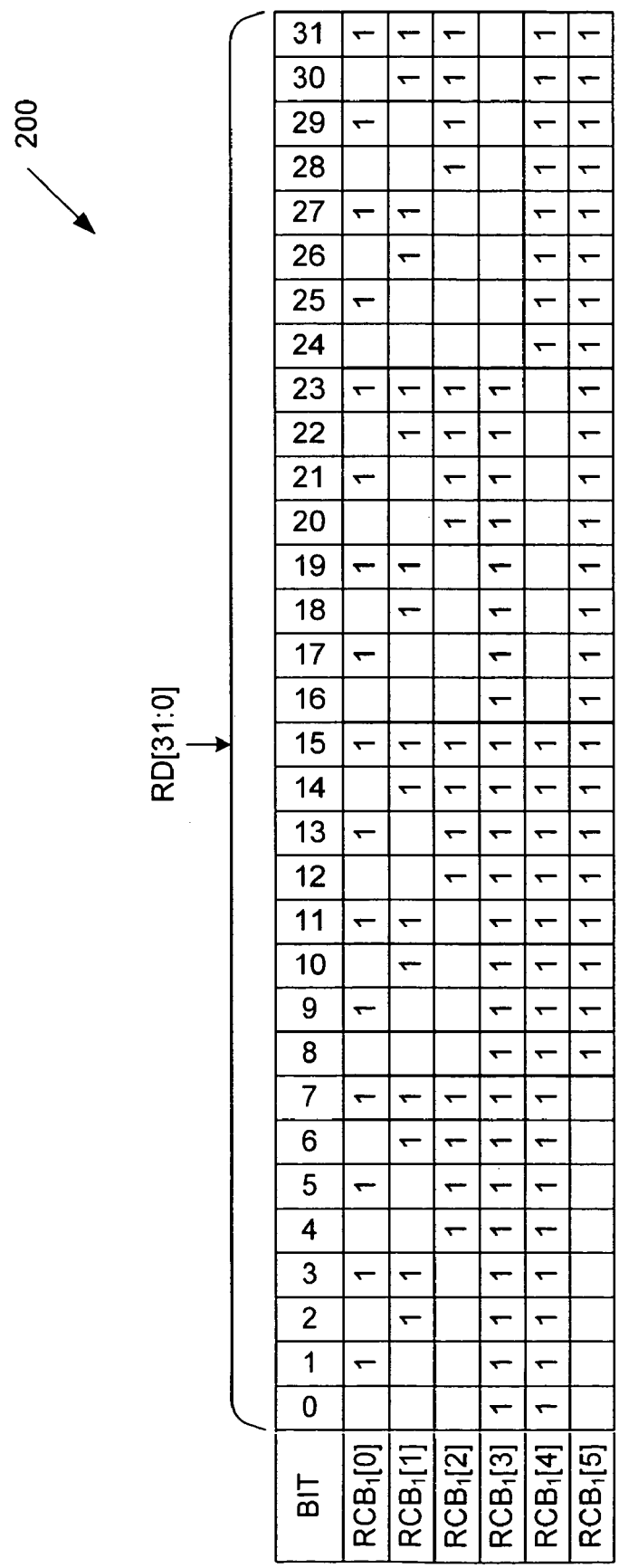
FIG. 2 is a table illustrating a modified Hamming code used to generate check bits in response to a data word, in accordance with one embodiment of the present invention.

ECC generator 102 generates a set of read check bits $RCB_1$ [5:0] in response to the received 32-bit read data word RD[31: 0]. FIG. 2 is a table 200 illustrating the modified Hamming code used to generate read check bits $RCB_1[5:0]$ in response to the read data word RD[31:0], in accordance with one embodiment of the present example. As described in more detail, the read check bits $RCB_0[5:0]$ were originally generated using the same modified Hamming code illustrated in table 200. Columns 0 to 63 of table 200 show the ECC code for the corresponding bits of the read data word RD[31:0]. Rows 0 to 5 shows the parity generation of the corresponding read check bits $RCB_1[5:0]$.

For example, read check bit $RCB_1[3]$ is generated by performing an exclusive OR operation on the indicated bits RD[0:23] of read data word RD[31:0]. If an odd number of the indicated bits have a logic "1" value, then read check bit $RCB_1[3]$ will have a logic "1" value. Conversely if an even number of the indicated bits have a logic "1" value, then read check bit $RCB_1[3]$ will have a logic "0" value. Read check bits $RCB_1[0:2]$ and $RCB_1[4:5]$ are generated in a similar manner in response to the indicated bits. In the described embodiment, ECC generator 102 incorporates 3-levels of exclusive OR logic gates. The exclusive-OR tree implementation of modified Hamming code is well understood in the field of error correction codes and therefore is not further elaborated. The described modified Hamming code allows for single-bit error correction.

Read check bit values $RCB_0[5:0]$ and $RCB_1[5:0]$ are provided to exclusive OR circuit 104. In response, exclusive OR circuit 104 performs a bit-wise comparison of the two read check bit values $RCB_0[5:0]$ and $RCB_1[5:0]$ using six 2-input exclusive OR gates. For example, if read check bit $RCB_0[0]$ matches read check bit $RCB_1[0]$, then exclusive OR circuit 104 will provide a corresponding syndrome bit SYN[0] having a logic "0" value. Thus, as long as the read check bits $RCB_0[5:0]$ match the read check bits $RCB_1[5:0]$, the syndrome word SYN[5:0] will have all logic "0" values (i.e., "000000")

Conversely, if read check bit $RCB_0[0]$ does not match read check bit $RCB_1[0]$, then exclusive OR circuit 104 will provide a corresponding syndrome bit SYN[0] having a logic "1" value. In the described modified Hamming code, if a single-bit error exists in the read data bits RD[7:0] (i.e., byte[0]) of the read data word RD[31:0], then the syndrome bits SYN[5:3] will have a value of "011". If a single-bit error exists in the read data bits RD[15:8] (i.e., byte[1]) of the read data word RD[31:0], then the syndrome bits SYN[5:3] will have a value of "111". If a single-bit error exists in the read data bits RD[23:16] (i.e., byte[2]) of the read data word RD[31:0], then the syndrome bits SYN[5:3] will have a value of "101". Finally, if a single-bit error exists in the read data bits RD[31:24] (i.e., byte[3]) of the read data word RD[31:0], then the syndrome bits SYN[5:3] will have a value of "110".

The syndrome bits SYN[2:0] have a value that identifies the location of the error bit within the read data word identified by the syndrome bits SYN[5:3]. For example, if syndrome bits SYN[5:3] have a value of "111" and syndrome bits SYN[2:0] have a value of "010", a single bit error exists in read data bit RD[10] (i.e., bit location [2] of byte[1]). In this manner, exclusive OR circuit 104 provides the syndrome word SYN[5:0].

Syndrome decoder 107 decodes the syndrome word SYN[5:0], thereby providing read error correction code RECC[31:0]. In the described embodiment, syndrome decoder 107 is a 6-to-32 decoder implemented using two levels of AND gates. This type of implementation using combinatorial logic is well known in the art of logic design and therefore is not described further. If there is a single-bit error associated with the read data word RD[31:0], the read error correction code RECC[31:0] provided by the 32-bit syndrome decoder 107 will exhibit a logic '1' bit that identifies the location of the single-bit error in read data value RD[31:0]. If there is no error associated with the read data word RD[31:0], then both the syndrome word SYN[5:0] and the read error correction code RECC[31:0] will have all logic "0" bits. The read data value RD[31:0] and the read error correction code RECC[31:0] are applied to exclusive OR circuit 105, thereby creating corrected read data value Q[31:0].

Figure 3:
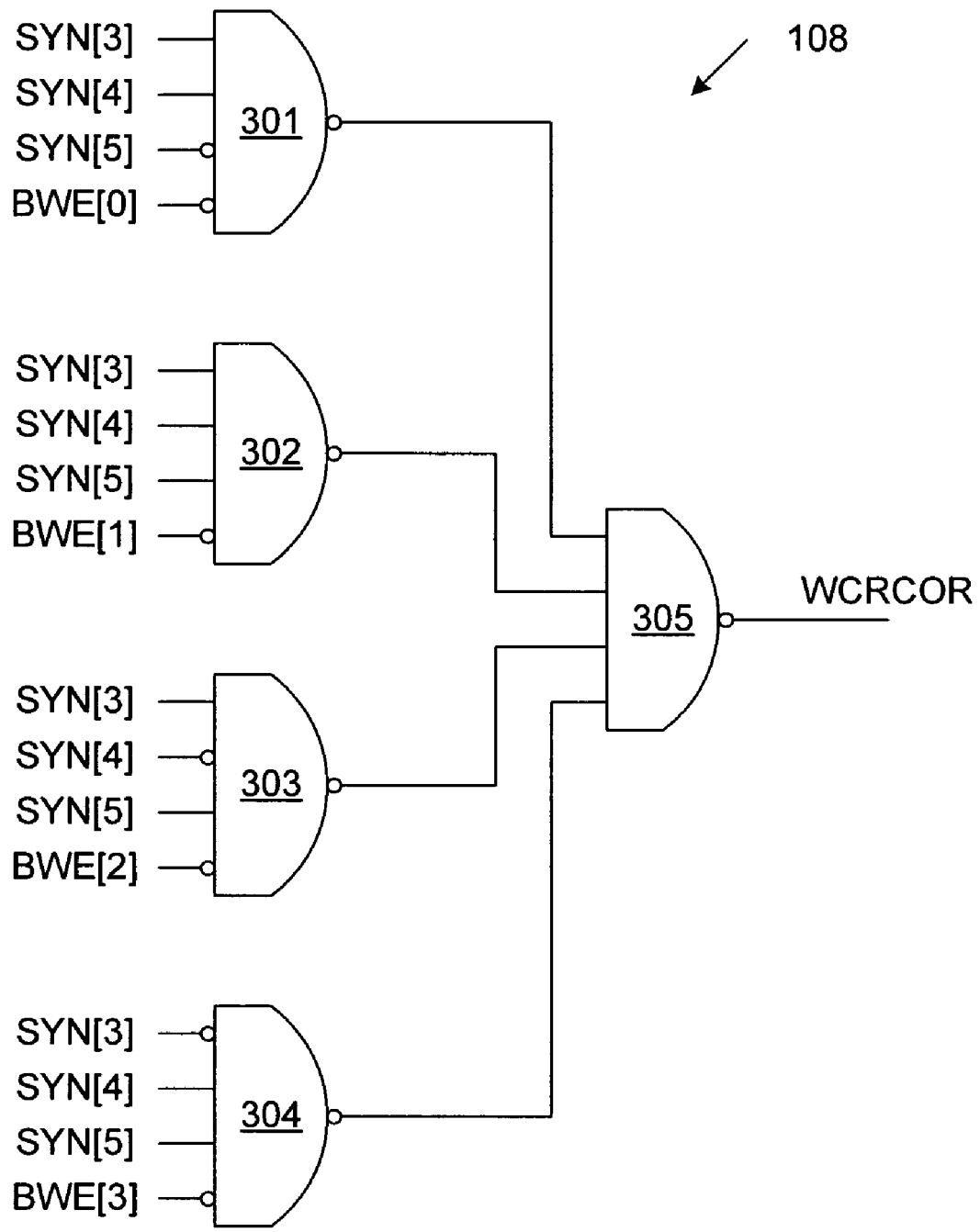
FIG. 3 is a circuit diagram of partial syndrome decoder in accordance with one embodiment of the present invention.

Partial syndrome decoder 108 also receives the syndrome word SYN[5:0] and the byte write enable signals BWE[3:0]. FIG. 3 is a circuit diagram of partial syndrome decoder 108 in accordance with one embodiment of the present invention. As described in more detail below, partial syndrome decoder 108 determines whether a single-bit error exists in a byte that is not being overwritten with new data, as identified by the byte write enable signals BWE[3:0]. Partial syndrome decoder 108 includes logic NAND gates 301-305, which are connected as illustrated.

Logic NAND gate 301 receives syndrome bits SYN[5:3] and byte write enable signal BWE[0], wherein syndrome bit SYN[5] and byte write enable signal BWE[0] are provided on inverting input terminals. If the syndrome bits SYN[5:3] have a value of "011" (indicating that a single bit error exists in read data byte RD[7:0] of read data word RD[31:0]) and the byte write enable signal BWE[0] has a logic "0" value (indicating that read data byte RD[7:0] is not being written in the present write operation), then NAND gate 301 provides a logic "0" output signal. Otherwise, NAND gate 301 provides a logic "1" output signal.

Logic NAND gate 302 receives syndrome bits SYN[5:3] and byte write enable signal BWE[1], wherein byte write enable signal BWE[1] is provided on an inverting input terminal. If the syndrome bits SYN[5:3] have a value of "111" (indicating that a single-bit error exists in read data byte RD[15:8]) and the byte write enable signal BWE[1] has a logic "0" value (indicating that read data byte RD[15:8] is not being written in the present write operation), then NAND gate 302 provides a logic "0" output signal. Otherwise, NAND gate 302 provides a logic "1" output signal.

Logic NAND gate 303 receives syndrome bits SYN[5:3] and byte write enable signal BWE[2], wherein syndrome bit SYN[4] and byte write enable signal BWE[2] are provided on inverting input terminals. If the syndrome bits SYN[5:3] have a value of "101" (indicating that a single bit error exists in read data byte RD[23:16]) and the byte write enable signal BWE[2] has a logic "0" value (indicating that read data byte RD[23:16] is not being written in the present write operation), then NAND gate 303 provides a logic "0" output signal. Otherwise, NAND gate 303 provides a logic "1" output signal.

Logic NAND gate 304 receives syndrome bits SYN[5:3] and byte write enable signal BWE[3], wherein syndrome bit SYN[3] and byte write enable signal BWE[3] are provided on inverting input terminals. If the syndrome bits SYN[5:3] have a value of "110" (indicating that a single bit error exists in read data byte RD[31:24]) and the byte write enable signal BWE[3] has a logic "0" value (indicating that read data byte RD[31:24] is not being written in the present write operation), then NAND gate 304 provides a logic "0" output signal. Otherwise, NAND gate 304 provides a logic "1" output signal.

If any of NAND gates 301-304 provides a logic "0" output signal, NAND gate 305 will provide a logic "1" write check bit correction (WCBCOR) signal. The logic "1" state of the WCBCOR signal indicates that a single-bit error exists in a read data byte that will be written back to memory array 101. If none of NAND gates 301-304 provides a logic "0" output signal, NAND gate 305 provides a logic "0" WCBCOR signal.

The WCBCOR signal is provided to AND circuit 110, along with syndrome word SYN[5:0]. Within AND circuit 110, each bit of the syndrome word SYN[5:0] is logically ANDed with the WCBCOR signal, thereby providing write check bits $WCB_1[5:0]$. If the WCBCOR signal has a logic "0" value, then all of the write check bits $WCB_1[5:0]$ have a logic "0" value. If the WCBCOR signal has a logic "1" value, then the syndrome word SYN[5:0] is effectively routed as the write check bits $WCB_1[5:0]$. The functionality of the write check bits $WCB_1[5:0]$ is described in more detail below.

The read data word RD[31:0] and the partial-word write data in write data value WD[31:0] are applied to multiplexer 109. The byte write enable signals BWE[3:0], which identify which of the four bytes in the read data word RD[31:0] are being replaced by bytes in the write data word WD[31:0], are applied to the control terminals of multiplexer 109.

Figure 4:
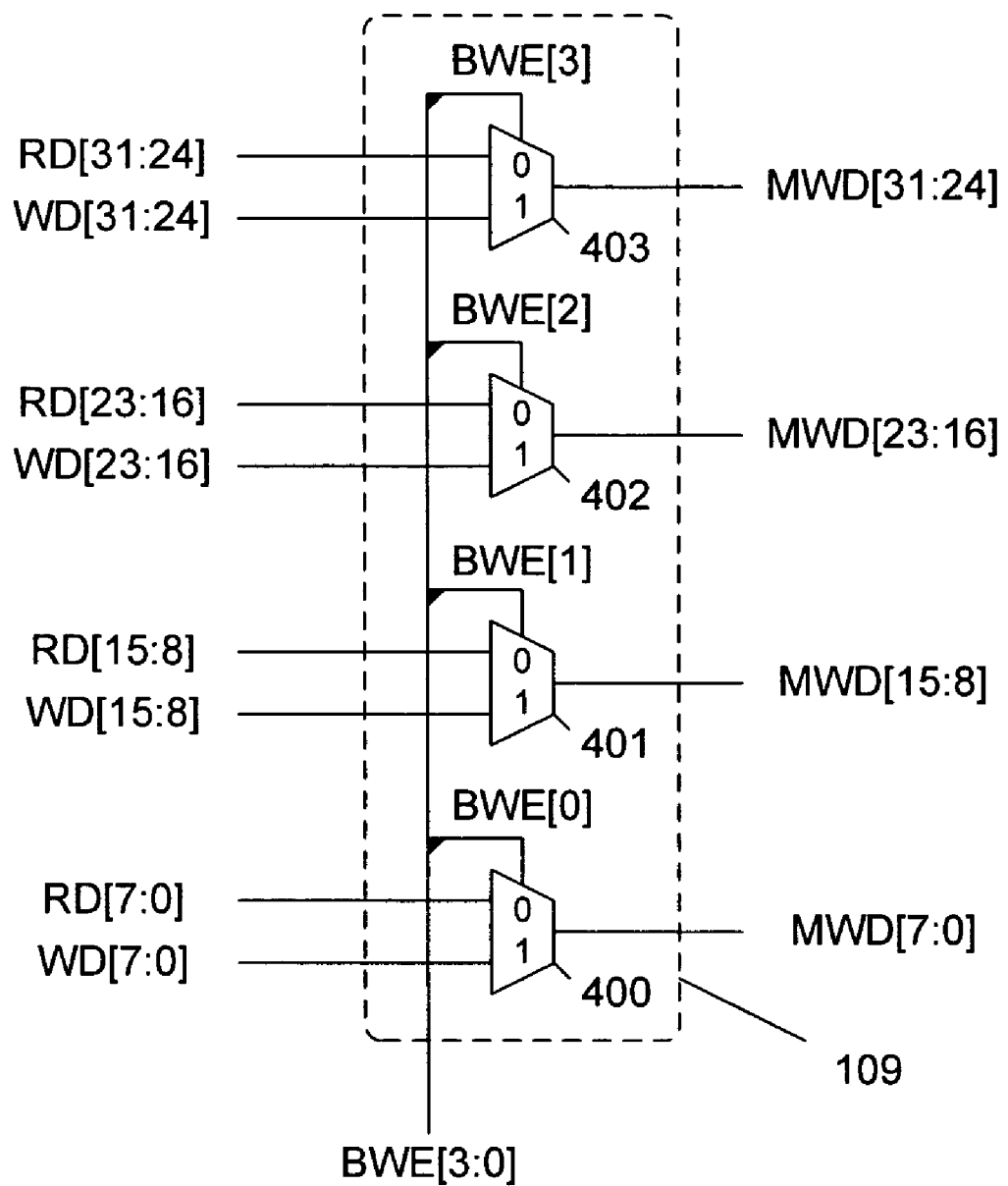
FIG. 4 is a block diagram of a multiplexer circuit used in accordance with one embodiment of the present invention.

FIG. 4 is a block diagram of multiplexer circuit 109 in accordance with one embodiment of the present invention. Multiplexer circuit 109 includes multiplexers 400, 401, 402 and 403, which are controlled by the byte write enable signals BWE[0], BWE[1], BWE[2] and BWE[3], respectively. Multiplexer 400 is configured to receive bytes RD[7:0] and WD[7:0] and provide merged write byte MWD[7:0]. Multiplexer 401 is configured to receive bytes RD[15:8] and WD[15:8] and provide merged write byte MWD[15:8]. Multiplexer 402 is configured to receive bytes RD[23:16] and WD[23:16] and provide merged write byte MWD[23:16]. Multiplexer 403 is configured to receive bytes RD[31:24] and WD[31:24] and provide merged write byte MWD[31:24].

If a byte write enable signal BWE[n] has a logic "1" value, then the associated write data byte WD is routed by multiplexer circuit 109. Conversely, if a byte write enable signal BWE[n] has a logic "0" value, then the associated read data byte RD is routed by multiplexer circuit 109. For example, byte write enable signals BWE[3:0] having values of "0011" would cause multiplexer circuit 109 to route the read data bytes RD[31:24] and RD[23:16] and the write data bytes WD[15:8] and WD[7:0], to create the merged write data value WMD[31:0].

The merged write data value MWD[31:0] is provided to ECC generator 103. In response, ECC generator 103 generates a set of write check bits $WCB_0[5:0]$ associated with the merged write data value MWD[31:0]. ECC generator 103 uses the same modified Hamming code as ECC generator 102. The new write check bits $WCB_0[5:0]$ are provided to exclusive OR circuit 106, along with write check bits $WCB_1[5:0]$.

Exclusive OR circuit 304 generates write check bits $WCB_2[5:0]$ in response to the write check bits $WCB_0[5:0]$ and $WCB_1[5:0]$.

As described above, if partial syndrome decoder 108 determines that there is no error in read data word RD[31:0], or that a single-bit error exists in a byte of the read data word RD[31:0] that is being overwritten by a byte of the write data word WD[31:0], the write check bits $WCB_1[5:0]$ will have all logic "0" values. In this case, the write check bits $WCB_0[5:0]$ are routed through exclusive OR circuit 106 without modification as the write check bits $WCB_2[5:0]$.

Also, as described above, if partial syndrome decoder 108 determines that there is a single-bit error in a byte of the read data word RD[31:0] that is not being overwritten by a byte of the write data word WD[31:0], the write check bits $WCB_1[5:0]$ will have a value equal to the syndrome word SYN[5:0]. In this case, the write check bits $WCB_1[5:0]$ will cause exclusive OR circuit 106 to modify the write check bits $WCB_0[5:0]$ to create the write check bits $WCB_2\{5:0]$. The significance of this modification is described in more detail below.

At the end of the write transaction, the merged write data MWD[31:0] and the write check bits $WCB_2[5:0]$ are written to memory array 101.

It is important to note that during the read-modify-write process of the present invention, ECC generator 102, exclusive OR circuit 104 and partial syndrome decoder 108 and logic AND circuit 110 operate in parallel with multiplexer circuit 109 and ECC generator 103. That is, read check bit generation, syndrome generation and partial syndrome decoding is executed in parallel with data merging and write check bit generation. As a result, the write check bits $WCB_0$ [31:0] are generated in response to the uncorrected read data word RD[31:0]. Thus, the write check bits $WCB_0[31:0]$ may contain incorrect values if an uncorrected error in the read data word RD[31:0] is actually used to generate the write check bits $WCB_0[31:0]$. As described above, this situation is indicated when the WCBCOR signal has a logic "1" value. In this case, the write check bits $WCB_0[5:0]$ are corrected when exclusive OR'ed with write check bits $WCB_1[5:0]$.

To illustrate the manner in which the write check bits $WCB_2[5:0]$ are correctly generated, assume that an error bit occurs in the read data word RD[31:0], such that the associated syndrome word SYN[5:0] has a non-zero value. The value of syndrome word SYN[5:0] is governed by the column (bit) location of the error bit in the parity-check matrix of FIG. 2. For example, if read data bit RD[12] has an error, the syndrome word SYN[5:0] will have a value of "111100". If this error bit RD[12] is not overwritten in the data merging process performed by multiplexer circuit 109, then the write check bits $WCB_0[5:0]$ generated in response to the merged write data word MWD[31:0] are incorrect. Indeed, the correct write check bits $WCB_2[5:0]$ and the incorrect write check bits $WCB_0[5:0]$ differ by a value equal to the write check bits $WCB_1[5:0]$. Therefore, the correct write check bits $WCB_2[5:0]$ can be obtained by performing a bit-wise exclusive OR operation on write check bits $WCB_0[5:0]$ and $WCB_1[5:0]$. In this manner, write check bits $WCB_2[31:0]$ are generated in a predictive manner.

Note that the single-bit errors in the read data word are not corrected during the read-modify-write operation. Rather, the present invention ensures that the write check bits are generated correctly even if the data bits in the merged write data word contain a single-bit error. In doing so, the present invention ensures that the single-bit error can be corrected if the data is read in a subsequent read transaction.

The total partial-word write time of the present embodiment thus consists of: (1) a memory read operation, (2) read check bit generation, (3) syndrome generation, (4) partial syndrome decode, (5) write check bit correction, and (6) data write to memory. Note that the steps of data merging and write check bit generation are done in parallel with read check bit generation and syndrome generation. Typical timing for transactions (1)-(6) in a memory having a capacity of 1M bits, a 38-bit ECC word and fabricated with a 0.13 um CMOS technology are: 1.5 ns, 1 ns, 0.1 ns, 0.1 ns, and 1.5 ns, respectively. The read-modify-write operation of the present invention therefore takes about 4.2 ns.

The predictive ECC generation in the read-modify-write process works correctly only if the ECC word, consisting of the read data word RD[31:0] and read check bits $RCB_0[5:0]$, has no more than 1 error bit. In general, this assumption is satisfied in an ECC that can only detect and correct for 1 error bit. However, in the condition when the memory has just been powered up or when the memory content has not been initialized, bits in any ECC word read from any memory location have random states. That is, the check bits and data bits have no relationship. Therefore, multiple bit errors may occur and the ECC detection and correction logic cannot handle this multiple-bit error correctly. As a result, the merged data word contains random data bits and the write check bits are not generated correctly. This problem can be resolved by writing to every location of the memory with 32-bit words before any partial-word-write transaction can take place. This memory initialization solution works because during word write, all the read data bits are overwritten by the write data word WD[31:0]. In addition, the high state in all the bits of BWE [3:0] causes partial syndrome decoder 108 to provide a logic "0" WCBCOR signal, thereby setting all the write check bits $WCB_1[5:0]$ to logic "0" values. As a result, the bit-wise exclusive OR circuit 106 passes the write check bits $WCB_0$[5:0] at the output of ECC generator 103 as the write check bits $WCB_2$[5:0]. Because the write check bits $WCB_2$[5:0] are generated directly from the merged data word MWD[31:0], and the merged data word MWD[31:0] is taken directly from the write data word WD[31:0], the memory location to which MWD[31:0] and $WCB_2$[5:0] are written will contain a ECC word which will contain one or zero error bits, assuming that the memory array 101 does not have more than one defective bit at the memory location. Thus, if all the memory locations are initialized with a word write before any partial-word write occurs, then memory system 100 can operate correctly. In applications, the memory can be initialized by performing 32-bit word write to all memory locations with a fixed data word, for example 00000000H, during system initialization or by performing a Built-In-Self-Test (BIST) operation before any read or write access. Alternatively, the initialization can be carried out one memory location at a time during normal system operation by making sure that the first write to any memory location is a 32-bit word write with all the byte-write enable bits in BWE[3:0] in the high state. Another alternative is to implement a memory clear function, which sets the content of every memory cell to zero state, such that the data word and ECC bits are consistent in every memory location. The clear function can be activated by a memory reset signal.

Although the invention has been described in connection with several embodiments, it is understood that this invention is not limited to the embodiments disclosed, but is capable of various modifications, which would be apparent to a person skilled in the art. For example, although the described embodiments have focused on a memory array using DRAM or SRAM cells, it is understood that a memory array using non-volatile memory cells can be implemented with minor modification. Such modification could be readily accomplished by one of ordinary skill in the art of memory design. In addition, although the described embodiments implement byte-write operations, it is understood that partial-word write operations having another quanta of data, such as a single-bit write operations, can be readily implemented. Thus, the invention is limited only by the following claims.

We claim:

1. A memory system comprising:
a memory array configured to store a plurality of data values and an associated plurality of error correction bits; and
a memory interface configured to support partial-word write operations to the memory array, wherein the memory interface is adapted to generate write check bits for the partial-word write operations in a predictive manner.

2. The memory system of claim 1, wherein the memory interface comprises:
a read data path including a first error correction code (ECC) generator and means for generating a syndrome word in response to the error correction bits read from the memory array and error correction bits provided by the first ECC generator; and
a write path comprising a multiplexer circuit for merging a partial write data value with an uncorrected data value read from the memory array to create a merged write data word, and a second ECC generator coupled to receive the merged write data word.

3. The memory system of claim 2, wherein the read data path is configured to operate in parallel with the write data path.

4. The memory system of claim 2, wherein the read data path further comprises a partial syndrome decoder coupled to receive the syndrome word and a partial-word write enable signal, wherein the partial syndrome decoder is configured to generate a control signal that indicates whether a partial-word of the read data word containing an error is not being overwritten.

5. A method of performing a partial-word write transaction in a memory system implementing error code correction, the method comprising:
reading a first data word having a plurality of partial-words and a set of read check bits from an address of a memory;
determining that an error exists in the first data word, and identifying a partial-word of the first data word, which contains the error;
merging one or more partial-words of the first data word with one or more partial-words of a write data word, thereby creating a merged data word, wherein the merged data word contains the error;
generating a set of write check bits in response to the merged data word;
modifying the set of write check bits in response to the first data word and the set of read check bits, thereby creating a modified set of write check bits; and
writing the merged data word and the modified set of write check bits to the address of the memory.

6. The method of claim 5, wherein the step of determining that an error exists in the first data word is performed in parallel with the steps of merging one or more partial-words of the first data word with one or more partial-words of a write data word and generating a set of write check bits in response to the merged data word.

7. A method of performing a partial-word write transaction in a memory system implementing error code correction, the method comprising:
reading a read data word and corresponding first set of read check bits from an address of a memory;
generating a second set of read check bits in response to the read data word;
generating a syndrome word in response to the first and second sets of read check bits, wherein the syndrome word identifies a location of an error, if any, in the read data word;
merging one or more partial-words of the read data word with one or more partial-words of a write data word, thereby creating a merged data word;
generating a first set of write check bits in response to the merged data word;
modifying the first set of write check bits to create a second set of write check bits if the merged data word includes a partial-word of the read data word which contains an error;
passing the first set of write check bits as the second set of write check bits if the merged data word does not include a partial-word of the read data word which contains an error; and
writing the merged data word and the second set of write check bits to the address of the memory.

8. The method of claim 7, wherein the steps of generating the second set of read check bits and generating the syndrome word are performed in parallel with the steps of merging one or more partial-words of the read data word with one or more partial-words of the write data word and generating the first set of write check bits.

9. A method of performing a partial-word write transaction in a memory system implementing error code correction, the method comprising:

reading a first data word and a corresponding set of check bits from an address of a memory;

determining that an error exists in the first data word read from the memory;

merging one or more partial-words of the first data word with one or more partial-words of a write data word, thereby creating a merged data word, wherein the merged data word contains the error of the first data word;

generating a first set of write check bits in response to the merged data word;

generating a second set of write check bits in response to the first data word and the corresponding set of check bits;

modifying the first set of write check bits in response to the second set of write check bits, thereby creating a third set of write check bits; and writing the merged data word and the third set of write check bits to the address of the memory.

* * * * *